(12) United States Patent
Liu et al.

(10) Patent No.: US 12,032,034 B2
(45) Date of Patent: Jul. 9, 2024

(54) CHARGE CURRENT TEST METHOD AND DEVICE, AND CHARGE TEST SYSTEM

(71) Applicant: CONTEMPORARY AMPEREX TECHNOLOGY CO., LIMITED, Ningde (CN)

(72) Inventors: Zhi Liu, Ningde (CN); Yuzhen Wang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 174 days.

(21) Appl. No.: 17/831,359

(22) Filed: Jun. 2, 2022

(65) Prior Publication Data

US 2023/0064748 A1 Mar. 2, 2023

Related U.S. Application Data

(63) Continuation of application No. PCT/CN2021/112141, filed on Aug. 11, 2021.

(51) Int. Cl.
*G01R 31/389* (2019.01)
*G01R 31/374* (2019.01)
(Continued)

(52) U.S. Cl.
CPC ......... *G01R 31/389* (2019.01); *G01R 31/374* (2019.01); *G01R 31/3842* (2019.01); *H02J 7/0049* (2020.01)

(58) Field of Classification Search
None
See application file for complete search history.

(56) References Cited

U.S. PATENT DOCUMENTS

| 5,825,159 A | 10/1998 | Patino |
| 2019/0128969 A1* | 5/2019 | Fang .................. G01R 31/3835 |
| 2021/0103002 A1 | 4/2021 | Li et al. |

FOREIGN PATENT DOCUMENTS

| CN | 102323553 A | 1/2012 |
| CN | 105388426 A | 3/2016 |

(Continued)

OTHER PUBLICATIONS

The European Patent Office (EPO) Extended Search Report for EP Application No. 21904626.5 Mar. 30, 2023 8 Pages.

(Continued)

*Primary Examiner* — Jas A Sanghera
(74) *Attorney, Agent, or Firm* — ANOVA LAW GROUP, PLLC (57) ABSTRACT

This application provides a charge current test method and device, and a charge test system. The method includes: charging a to-be-tested battery at a first current under a first temperature until a voltage of the to-be-tested battery reaches a preset cutoff voltage, stopping charging whenever an increment of a state-of-charge value of the to-be-tested battery reaches a preset value during the charging of the to-be-tested battery, and continuing to charge after a duration of stopping charging reaches a first preset time length; calculating an impedance of the to-be-tested battery during the first preset time length; and determining, based on the impedance, a maximum state-of-charge value that is allowed to be reached when the charging is performed at the first current under the first temperature.

20 Claims, 5 Drawing Sheets

(51) Int. Cl.
*G01R 31/3842* (2019.01)
*H02J 7/00* (2006.01)

(56) References Cited

FOREIGN PATENT DOCUMENTS

| | | |
|---|---|---|
| CN | 106125002 A | 11/2016 |
| CN | 106680726 A | 5/2017 |
| CN | 110687468 A | 1/2020 |
| CN | 111007417 A | 4/2020 |
| CN | 112684356 A | 4/2021 |
| CN | 113125981 A | 7/2021 |
| WO | 2020108970 A1 | 6/2020 |

OTHER PUBLICATIONS

The World Intellectual Property Organization (WIPO) International Search Report and written opinion for PCT/CN2021/112141 Apr. 26, 2022 11 pages (including English translation).

* cited by examiner

CHARGE CURRENT TEST METHOD AND DEVICE, AND CHARGE TEST SYSTEM

CROSS-REFERENCE TO RELATED APPLICATION

This application is a continuation application of PCT Patent Application No. PCT/CN2021/112141, entitled "A CHARGING CURRENT TEST METHOD, DEVICE AND CHARGING TEST SYSTEM" filed on Aug. 11, 2021, which is incorporated herein by reference in its entirety.

TECHNICAL FIELD

This application relates to the technical field of batteries, and in particular, to a charge current test method and device, and a charge test system.

BACKGROUND

With the popularization of electric vehicles, there is widespread concern for the charging safety of rechargeable batteries (such as a lithium battery). How to increase a charge current and reduce the charging time maximally without affecting the service life and safety performance of the battery has always been a research target of researchers.

Currently, a most commonly used method is to make a three-electrode battery with a reference electrode to research a relationship between the current and a state of charge. Specifically, a voltage between a negative electrode and a reference electrode, that is, a potential change of the negative electrode, is monitored during charging of the battery. In a general opinion, the battery is charged at a current of I0. When the battery is charged until a state of charge (SOC) of A % ($0 \leq A \leq 100$), if the potential of the negative electrode drops to less than 0 mV, it is considered that the battery begins to be abnormal (for example, lithium plating occurs in a lithium battery), and further charging will affect the service life and performance of the battery. The charge current I0 in this case is defined as a maximum charge current allowed to be used for charging the battery until a SOC of A %. The foregoing method is merely applicable to a simply structured laminated battery with a small capacity. For a battery with a complex structure, the location and the manufacturing method of the reference electrode will bring a significant impact on test results of the current and the state of charge.

SUMMARY

An objective of embodiments of this application is to provide a charge current test method and device, and a charge test system to easily and accurately test a correspondence between a charge current and a maximum state-of-charge value.

This application is implemented in the following way:

According to a first aspect, an embodiment of this application provides a charge current test method, including: charging a to-be-tested battery at a first current under a first temperature until a voltage of the to-be-tested battery reaches a preset cutoff voltage, stopping charging whenever an increment of a state-of-charge value of the to-be-tested battery reaches a preset value during the charging of the to-be-tested battery, and continuing to charge after a duration of stopping charging reaches a first preset time length; calculating an impedance of the to-be-tested battery during the first preset time length; and determining, based on the impedance, a maximum state-of-charge value that is allowed to be reached when the charging is performed at the first current under the first temperature.

In the test method according to this embodiment of this application, the charging is stopped whenever the increment of the state-of-charge value of the to-be-tested battery reaches the preset value while the to-be-tested battery is charged at the first current under the first temperature. The charging is continued after the duration of stopping charging reaches the first preset time length. The impedance during each first preset time length is calculated, and the maximum state-of-charge value that is allowed to be reached when the charging is performed at the first current under the first temperature is determined based on the impedance. In this way, the impedance change of the to-be-tested battery during the charging can be determined. In the foregoing process, whether a side reaction occurs in the to-be-tested battery can be determined based on the impedance change, and then the correspondence between the charge current of the to-be-tested battery and the state-of-charge value can be accurately determined. Compared with the prior art, the foregoing solution enables direct test of most commercial batteries on the market without a need to manufacture a special-purpose three-electrode battery. In addition, the solution takes temperature into account, thereby improving accuracy of test results. In addition, the solution can also test batteries that have aged in any aging state, and is widely applicable.

With reference to the technical solution provided in the first aspect, in some possible implementations, the impedance=(the voltage of the to-be-tested battery when the charging is stopped−the voltage of the to-be-tested battery after the charging has been stopped for the first preset time length)/the first current.

With reference to the technical solution provided in the first aspect, in some possible implementations, the determining, based on the impedance, a maximum state-of-charge value that is allowed to be reached when the charging is performed at the first current under the first temperature includes: obtaining a state-of-charge value corresponding to each of the impedances; and determining, when an impedance corresponding to a next state-of-charge value is less than an impedance corresponding to a previous state-of-charge value for a first time after a preset state-of-charge value, that the maximum state-of-charge value is the previous state-of-charge value.

In this embodiment of this application, if a side reaction occurs in the to-be-tested battery during the charging, the impedance of the to-be-tested battery during the first preset time length will decrease after the preset state-of-charge value. Based on the foregoing principles, when the impedance corresponding to the next state-of-charge value is less than the impedance corresponding to the previous state-of-charge value for the first time after the preset state-of-charge value, it is determined that the maximum state-of-charge value is the previous state-of-charge value. That is, the maximum state-of-charge value that is allowed to be reached when the to-be-tested battery is charged at the first current under the first temperature can be obtained.

With reference to the technical solution provided in the first aspect, in some possible implementations, the determining, based on the impedance, a maximum state-of-charge value that is allowed to be reached when the charging is performed at the first current under the first temperature includes: obtaining a state-of-charge value corresponding to each of the impedances; and determining, when an impedance corresponding to each next state-of-charge value is greater than an impedance corresponding to a previous state-of-charge value after a preset state-of-charge value, that the maximum state-of-charge value is a state-of-charge value corresponding to the preset cutoff voltage.

In this embodiment of this application, if no side reaction occurs in the to-be-tested battery, the impedance of the to-be-tested battery during the first preset time length takes on a trend to increase monotonically after the preset state-of-charge value. Based on the foregoing principles, when the impedance corresponding to each next state-of-charge value is greater than the impedance corresponding to the previous state-of-charge value after the preset state-of-charge value, it is determined that the maximum state-of-charge value is a state-of-charge value corresponding to the preset cutoff voltage. That is, the maximum state-of-charge value that is allowed to be reached when the to-be-tested battery is charged at the first current under the first temperature can be obtained.

With reference to the technical solution provided in the first aspect, in some possible implementations, before the charging the to-be-tested battery at the first current under the first temperature, the method further includes: obtaining an actual capacity of the to-be-tested battery under a room temperature; and discharging the to-be-tested battery that has been left to stand for a second preset time length under the room temperature, until the voltage of the to-be-tested battery reaches a lower-limit cutoff voltage.

In this embodiment of this application, the to-be-tested battery that has been left to stand for the second preset time length under the room temperature is discharged until the voltage of the to-be-tested battery reaches the lower-limit cutoff voltage. This ensures that the to-be-tested battery reaches thermal equilibrium under the room temperature. In addition, this brings an effect that the state-of-charge value of the to-be-tested battery at the start of a subsequent test is 0%, thereby obtaining test data of a complete charging process.

With reference to the technical solution provided in the first aspect, in some possible implementations, the charging a to-be-tested battery at a first current under a first temperature includes: charging, at the first current, the to-be-tested battery that has been left to stand for a third preset time length under the first temperature.

In this embodiment of this application, the to-be-tested battery is left to stand under the first temperature for the third preset time length, so as to ensure that the to-be-tested battery reaches thermal equilibrium under the first temperature, and thereby improve stability of the to-be-tested battery in a subsequent charging process.

With reference to the technical solution provided in the first aspect, in some possible implementations, before the charging the to-be-tested battery at the first current under the first temperature, the method further includes: estimating a current state-of-charge value of the to-be-tested battery.

In this embodiment of this application, the current state-of-charge value of the to-be-tested battery is estimated first before the charging, so as to obtain the test data of a charging process that begins with the current state-of-charge value.

With reference to the technical solution provided in the first aspect, in some possible implementations, the method further includes: charging the to-be-tested battery at a second current under a second temperature until the voltage of the to-be-tested battery reaches the preset cutoff voltage, stopping charging whenever the increment of the state-of-charge value of the to-be-tested battery reaches the preset value during the charging of the to-be-tested battery, and continuing to charge after the duration of stopping charging reaches the first preset time length; calculating the impedance of the to-be-tested battery during the first preset time length while the charging is performed at the second current; and determining, based on the impedance obtained by charging at the second current, a maximum state-of-charge value that is allowed to be reached when the charging is performed at the second current under the second temperature.

In this embodiment of this application, the to-be-tested battery may be tested under conditions different from the first temperature and the first current, so as to obtain more test data about the to-be-tested battery.

With reference to the technical solution provided in the first aspect, in some possible implementations, the impedance obtained by charging at the second current=(the voltage of the to-be-tested battery when the charging is stopped−the voltage of the to-be-tested battery after the charging has been stopped for the first preset time length)/the second current.

With reference to the technical solution provided in the first aspect, in some possible implementations, after the determining, based on the impedance obtained by charging at the second current, the maximum state-of-charge value that is allowed to be reached when the charging is performed at the second current under the second temperature, the method further includes: constructing a charge current matrix table based on the first temperature, the first current, the second temperature, the second current, the maximum state-of-charge value that is allowed to be reached when the charging is performed at the first current under the first temperature, and the maximum state-of-charge value that is allowed to be reached when the charging is performed at the second current under the second temperature.

In this embodiment of this application, the charge current matrix table is constructed from the test data to intuitively obtain the correspondence between the current, the temperature, and the maximum state of charge.

According to a second aspect, an embodiment of this application provides a charge current test device, including: a charge control module, configured to charge a to-be-tested battery at a first current under a first temperature until a voltage of the to-be-tested battery reaches a preset cutoff voltage, stop charging whenever an increment of a state-of-charge value of the to-be-tested battery reaches a preset value during the charging of the to-be-tested battery, and continue to charge after a duration of stopping charging reaches a first preset time length; a calculation module, configured to calculate an impedance of the to-be-tested battery during the first preset time length; and a determining module, configured to determine, based on the impedance, a maximum state-of-charge value that is allowed to be reached when the charging is performed at the first current under the first temperature.

According to a third aspect, an embodiment of this application provides a charge test system, including: a charging device and a temperature control device. The temperature control device is configured to control a test temperature of a to-be-tested battery. The charging device includes a controller, a charge control circuit, and a voltage collection circuit. The controller is connected to the charge control circuit and the voltage collection circuit separately. The charge control circuit is configured to charge the to-be-tested battery. The voltage collection circuit is configured to obtain a voltage of the to-be-tested battery. The controller is configured to perform the method provided in the embodiments of the first aspect and/or with reference to some possible implementations of the embodiments of the first aspect.

According to a fourth aspect, an embodiment of this application provides a computer-readable storage medium on which a computer program is stored. When executed by a processor, the computer program implements the method according to the embodiment of the first aspect and/or with reference to some possible implementations of the embodiment of the first aspect.

BRIEF DESCRIPTION OF DRAWINGS

To describe technical solutions in embodiments of this application more clearly, the following outlines the drawings to be used in the embodiments of this application. Understandably, the following drawings show merely some embodiments of this application, and therefore, are not intended to limit the scope. A person of ordinary skill in the art may derive other related drawings from the drawings without making any creative efforts.

Reference numerals: 100—charge test system; 10—charging device; 101—controller; 102—charge control circuit; 103—voltage collection circuit; 20—temperature control device; 300—charge current test device; 301—charge control module; 302—calculation module; and 303—determining module.

DETAILED DESCRIPTION OF EMBODIMENTS

The following describes technical solutions in embodiments of this application with reference to the drawings in the embodiments of this application.

Figure 1:
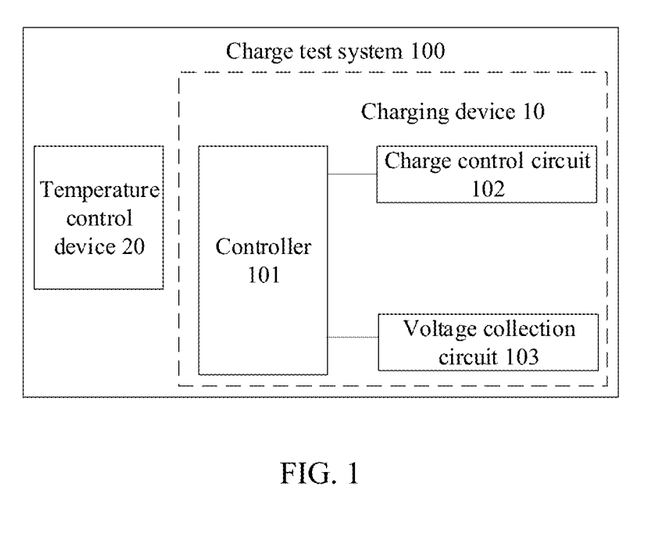
FIG. 1 is a modular block diagram of a charge test system according to an embodiment of this application.

Referring to FIG. 1, an embodiment of this application provides a charge test system 100, including a charging device 10 and a temperature control device 20.

The charge test system 100 is configured to test a to-be-tested battery. The to-be-tested battery may be, but is not limited to, a lithium battery or a sodium battery.

In testing the to-be-tested battery, the to-be-tested battery needs to be placed in a temperature control device 20, and the to-be-tested battery is connected to the charging device 10.

The charging device 10 includes a controller 101, a charge control circuit 102, and a voltage collection circuit 103. The controller 101 is connected to the charge control circuit 102 and the voltage collection circuit 103 separately.

The to-be-tested battery is electrically connected to the charge control circuit 102 and the voltage collection circuit 103 separately. The charge control circuit 102 is configured to control charging of the to-be-tested battery, and the voltage collection circuit 103 is configured to obtain the voltage of the to-be-tested battery.

Both the charge control circuit 102 and the voltage collection circuit 103 are circuit structures well known in the art, details of which are omitted herein.

The controller 101 is configured to trigger the charge control circuit 102 to charge the to-be-tested battery, and calculate an impedance based on the voltage of the to-be-tested battery collected by the voltage collection circuit 103. Specifically, the controller 101 is configured to trigger the charge control circuit 102 to charge the to-be-tested battery at a first current until the voltage of the to-be-tested battery reaches a preset cutoff voltage, stop charging whenever an increment of a state-of-charge value of the to-be-tested battery reaches a preset value during the charging of the to-be-tested battery, and continue to charge after a duration of stopping charging reaches a first preset time length; calculate an impedance of the to-be-tested battery during the first preset time length; and determine, based on the impedance, a maximum state-of-charge value that is allowed to be reached when the charging is performed at the first current under the first temperature.

The specific control logic of the controller 101 will be described in detail in subsequent embodiments, and the details are not given here.

The controller 101 may be an integrated circuit chip capable of processing signals. The controller 101 may be a general-purpose processor, and may be, for example, a central processing unit (CPU), a digital signal processor (DSP), an application specific integrated circuit (ASIC), a discrete gate or a transistor logic device, or a discrete hardware component, and can implement or perform the methods, steps, and logical block diagrams disclosed in the embodiments of this application. In addition, the general-purpose processor may be a microprocessor, or any conventional processor or the like.

The temperature control device 20 is configured to control a test temperature of the to-be-tested battery.

The temperature control device 20 may be, but is not limited to, a thermostat or a temperature control unit.

In an implementation, the temperature control device 20 may be manually controlled by test staff. For example, if the current test temperature required for testing the to-be-tested battery is 20° C., the test staff may manually adjust the temperature of the temperature control device 20 to 20° C.

In another implementation, the temperature control device 20 may be connected to the controller 101. The controller 101 exercises control over the temperature of the temperature control device 20 based on a preset policy. The preset policy is set by the test staff. For example, the policy is to charge the to-be-tested battery at a current of IA under 15° C. Therefore, the controller 101 controls the temperature of the temperature control device 20 to be 15° C., and controls the charge control circuit 102 to charge the to-be-tested battery at the current of IA.

In some embodiments, the temperature control device 20 may be further connected to the to-be-tested battery to monitor a surface temperature change of the to-be-tested battery during the test and ensure safety during the test.

It needs to be noted that the structure shown in FIG. 1 is merely illustrative. The charge test system 100 provided in this embodiment of this application may include fewer or more components than those shown in FIG. 1, or may have a configuration different from that shown in FIG. 1. In addition, the components shown in FIG. 1 may be implemented by software, hardware, or a combination thereof.

Figure 2:
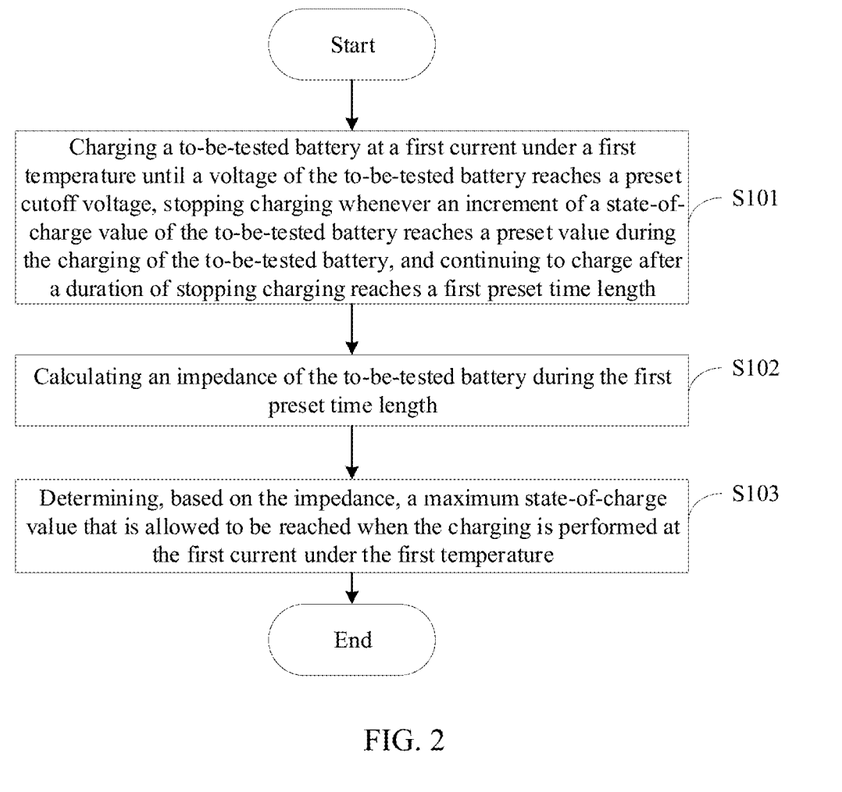
FIG. 2 is a flowchart of steps of a charge current test method according to an embodiment of this application.

Referring to FIG. 2, FIG. 2 is a flowchart of steps of a charge current test method according to an embodiment of this application. This method is applied to the controller 101 of the charge test system 100 shown in FIG. 1. It needs to be noted that the charge current test method according to this embodiment of this application is not limited to the order shown in FIG. 2 or the order described below. The method includes step S101 to step S103.

Step S101: Charging a to-be-tested battery at a first current under a first temperature until a voltage of the to-be-tested battery reaches a preset cutoff voltage, stopping charging whenever an increment of a state-of-charge value of the to-be-tested battery reaches a preset value during the charging of the to-be-tested battery, and continuing to charge after a duration of stopping charging reaches a first preset time length.

The first temperature, the first current, the preset value, and the first preset time length may be set as actually required. For example, the first temperature is 15° C. (temperature unit: degree Celsius) or 20° C.; and the first current is 30 A (current unit: ampere) or 40 A. The preset value may be 5%, 10%, or 20%, and the first preset time length may be any value ranging from 1 to 100 seconds, without being limited in this application.

In this embodiment of this application, the preset cutoff voltage is an upper-limit cutoff voltage of the to-be-tested battery. The upper-limit cutoff voltage means a voltage of the battery that reaches a fully charged state while the battery is charged at a specified constant current. The upper-limit cutoff voltage makes it convenient to determine a relationship between the first current and the maximum state-of-charge value corresponding to the upper-limit cutoff voltage throughout a process from the start of charging to a moment at which the voltage of the to-be-tested battery being charged reaches the upper-limit cutoff voltage. The preset cutoff voltage may be set as required. For example, the preset cutoff voltage may be any voltage lower than the upper-limit cutoff voltage of the to-be-tested battery. This is not limited in this application.

It needs to be noted that step S101 is a cyclic process. Whenever the charge increment of the to-be-tested battery reaches the preset value while the to-be-tested battery is charged at the first current under the first temperature until the preset cutoff voltage, the controller controls the to-be-tested battery to stop charging, and then continues to charge after the charging has been stopped for the first preset time length.

Here is an example in which the first temperature is 25° C., the first current is 30 A, the preset value is 10%, the first preset time length is 50 seconds, and the preset cutoff voltage is 4 V. Whenever the charge increment of the to-be-tested battery reaches 10% (for example, the state-of-charge value of the to-be-tested battery increases from 40% to 50%) while the to-be-tested battery is charged at a current of 30 A under a 25° C. environment until the voltage reaches 4 V, the controller controls the charging of the to-be-tested battery to stop for 50 seconds, and then continues to charge after the charging has been stopped for 50 seconds. When another charge increment of the to-be-tested battery reaches 10% again, the controller controls the charging of the to-be-tested battery to stop for another 50 seconds, and then continues to charge after the charging has been stopped for 50 seconds. The charge test is ended when the voltage of the to-be-tested battery reaches 4 V.

In some embodiments, the charge current test method according to this embodiment of this application can test a fully discharged to-be-tested battery, and can also test a to-be-tested battery in any state of charge.

When the method is applied to test a fully discharged to-be-tested battery, before step S101, the method further includes: obtaining an actual capacity of the to-be-tested battery under a room temperature; and discharging the to-be-tested battery that has been left to stand for a second preset time length under the room temperature, until the voltage of the to-be-tested battery reaches a lower-limit cutoff voltage.

It needs to be noted that in this field, the room temperature is generally defined as 25° C. The second preset time length is any time length greater than 1 hour. For example, the second preset time length may be 1.2 hours or 2 hours, without being limited in this application. The lower-limit cutoff voltage generally means a minimum operating voltage of the battery at which the battery is unsuitable for further discharging in a discharging process.

Specifically, after the to-be-tested battery is obtained, the actual capacity of the to-be-tested battery is tested first, and then the to-be-tested battery is left to stand under the room temperature for a second preset time length to ensure that the to-be-tested battery reaches thermal equilibrium under the room temperature. Finally, the to-be-tested battery subjected to the standing is discharged until the voltage reaches a lower-limit cutoff voltage to obtain a fully discharged to-be-tested battery.

The method for testing the actual capacity of the to-be-tested battery may be a commonly used test method. For example, the to-be-tested battery is discharged at a constant current under the room temperature (the discharge rate may be 0.04 C to 1.0 C, where C is a rate of a charge or discharge current of the battery) until the lower-limit cutoff voltage, and then the to-be-tested battery is charged at a constant current (the charge rate may be 0.04 C to 1.0 C) until the upper-limit cutoff voltage, and then the to-be-tested battery is charged at a constant voltage equal to the upper-limit cutoff voltage until the current reaches a minimum rate (0.01 C to 0.1 C). Then the to-be-tested battery is discharged again at a constant current (the discharge rate may be 0.04 C to 1.0 C) until the lower-limit cutoff voltage, and the discharge capacity at this time is recorded as CO. To ensure accuracy of CO, the foregoing process may be repeated for N cycles (N is a natural number greater than 1), and CO obtained in the $N^{th}$ cycle is recorded as the actual capacity.

In this embodiment of this application, the to-be-tested battery that has been left to stand for the second preset time length under the room temperature is discharged until the voltage of the to-be-tested battery reaches the lower-limit cutoff voltage. This ensures that the to-be-tested battery reaches thermal equilibrium under the room temperature. In addition, this brings an effect that the state-of-charge value of the to-be-tested battery at the start of a subsequent test is 0%, thereby obtaining test data of a complete charging process.

In addition, when the method is applied to test a fully discharged to-be-tested battery, a fully discharged battery with a determined actual capacity may be used as the to-be-tested battery directly.

When the method is applied to test the to-be-tested battery in any state of charge, in order to facilitate subsequent test statistics, before step S101, the method further includes: estimating a current state-of-charge value of the to-be-tested battery.

It needs to be noted that the method for estimating the to-be-tested battery may be any method well known in the art. For example, the estimation method may be: determining the current state-of-charge value by looking up in a table based on a detected voltage of the to-be-tested battery, without being limited in this application.

Assuming that the current state-of-charge value of the to-be-tested battery is estimated to be 20%, the to-be-tested battery is charged from a state of charge of 20%. Assuming that the current state-of-charge value of the to-be-tested battery is estimated to be 30%, the to-be-tested battery is charged from a state of charge of 30%.

In some embodiments, in order to ensure stability of the to-be-tested battery in the charging process, step S101 in which the to-be-tested battery is charged at the first current under the first temperature specifically includes: charging, at the first current, the to-be-tested battery that has been left to stand for a third preset time length under the first temperature.

The third preset time length is any time length greater than 1 hour. For example, the third preset time length may be 1.3 hours or 1.5 hours, without being limited in this application. After the to-be-tested battery is obtained, if the first temperature is determined, the to-be-tested battery is left to stand under the first temperature for the third preset time length to ensure that the to-be-tested battery reaches thermal equilibrium under the first temperature.

Step S102: Calculating an impedance of the to-be-tested battery during the first preset time length.

During the first preset time length in which the charging of the to-be-tested battery is stopped, the controller is configured to calculate an impedance of the to-be-tested battery in this time length. A formula for calculating the impedance is:

impedance=(the voltage of the to-be-tested battery when the charging is stopped−the voltage of the to-be-tested battery after the charging has been stopped for the first preset time length)/the first current.

When the increment of the state-of-charge value of the to-be-tested battery reaches a preset value, the controller obtains a voltage of the to-be-tested battery through the voltage collection circuit at this time. When the duration of stopping charging reaches the first preset time length, the controller obtains a voltage of the to-be-tested battery again through the voltage collection circuit. Then the controller subtracts the subsequently obtained voltage from the previously obtained voltage to obtain a difference, and divides the difference by the first current at which the to-be-tested battery is charged, so as to obtain the impedance of the to-be-tested battery during the first preset time length.

It needs to be noted that, during each first preset time length in which the charging of the to-be-tested battery is stopped, the controller obtains a corresponding impedance. The controller may obtain the impedance during each first preset time length in which the charging is stopped, or, the controller obtains merely voltage values at two end moments during each first preset time length in which the charging is stopped, and then uniformly calculates the impedance of the to-be-tested battery during each time length after the charging is ended.

In other embodiments, the impedance may be calculated by using a difference between the voltages corresponding to two arbitrary moments during the first preset time length, without being limited in this application.

Step S103: Determining, based on the impedance, a maximum state-of-charge value that is allowed to be reached when the charging is performed at the first current under the first temperature.

Finally, the controller determines, based on the obtained impedance, the maximum state-of-charge value that is allowed to be reached when the charging is performed at the first current under the first temperature.

In this embodiment of this application, the maximum state-of-charge value that is allowed to be reached when the charging is performed at the first current under the first temperature is determined based on the state-of-charge value corresponding to each impedance. In the foregoing implementation, two different circumstances exist.

First circumstance: when an impedance corresponding to a next state-of-charge value is less than an impedance corresponding to a previous state-of-charge value for a first time after a preset state-of-charge value, it is determined that the maximum state-of-charge value is the previous state-of-charge value.

The preset state-of-charge value is a state value that is set depending on the to-be-tested battery. It needs to be noted that, due to inherent characteristics of the to-be-tested battery, when the state-of-charge value of the to-be-tested battery is in a range of 20% to 60%, the calculated impedance will exhibit a significant numerical fluctuation. Therefore, in order to avoid the impact caused by the fluctuation onto the test result, a state-of-charge value is set, and the maximum state-of-charge value that is allowed to be reached when the charging is performed at the first current under the first temperature is determined based on the impedance change subsequent to the preset state-of-charge value. The state-of-charge value may be 50% or 60%, without being limited in this application.

In the first circumstance, when the impedance value decreases for the first time after the preset state-of-charge value, it is determined that the state-of-charge value corresponding to the previous impedance value is the maximum state-of-charge value that is allowed to be reached when the charging is performed at the first current under the first temperature.

In this embodiment of this application, the maximum state-of-charge value that is allowed to be reached when the charging is performed at the first current under the first temperature is determined directly based on the impedance value. Alternatively, a schematic diagram of the variation relationship between the impedance and the state-of-charge value is constructed to determine the maximum state-of-charge value that is allowed to be reached when the charging is performed at the first current under the first temperature.

Figure 3:
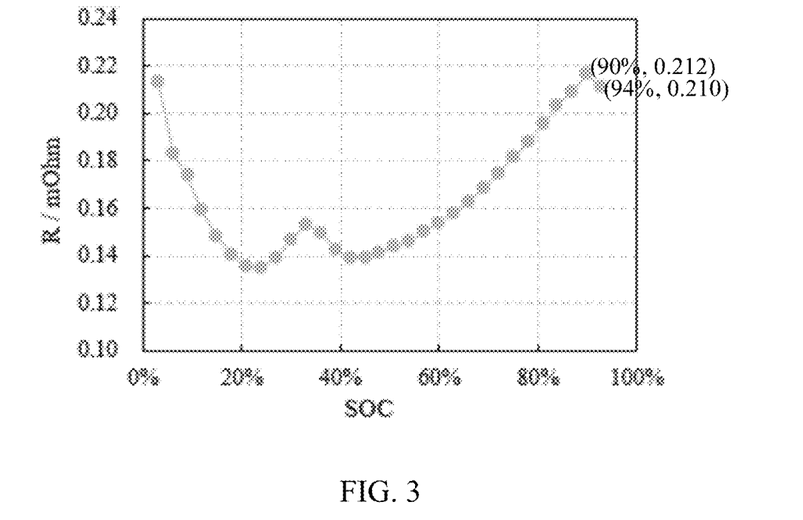
FIG. 3 is a schematic diagram of a variation relationship between an impedance and a state-of-charge value according to an embodiment of this application.

Referring to FIG. 3, FIG. 3 is a schematic diagram of a variation relationship between an impedance and a state-of-charge value, where a horizontal coordinate shows the state-of-charge (SOC) value of the to-be-tested battery, and a vertical coordinate shows a calculated impedance R. It is assumed that the preset state-of-charge value is 50%. When the impedance value corresponding to a state of charge of 94% of the to-be-tested battery is less than the impedance value corresponding to a state of charge of 90% for the first time, it is determined that the state of charge of 90% is the maximum state-of-charge value that is allowed to be reached when the charging is performed at the first current under the first temperature.

It needs to be noted that a reason for the decrease in impedance lies in a side reaction occurring during the charging of the to-be-tested battery (a side reaction process is equivalent to adding a parallel branch, thereby reducing the overall impedance). For example, when a lithium battery is charged to a state of charge of 90% at the first current, lithium plating may occur in the lithium battery, thereby decreasing the impedance of the lithium battery. To avoid the side reaction during the charging of the to-be-tested battery, the state of charge of 90% in FIG. 3 is determined to be the maximum state-of-charge value that is reachable when the charging is performed at the first current.

Second circumstance: when an impedance corresponding to each next state-of-charge value is greater than an impedance corresponding to a previous state-of-charge value after a preset state-of-charge value, it is determined that the maximum state-of-charge value is a state-of-charge value corresponding to the preset cutoff voltage.

The preset state-of-charge value in the second circumstance is set in the same way as the preset state-of-charge value in the first circumstance. For the same content, reference may be made between the two circumstances, and details are omitted here.

In the second circumstance, the impedance corresponding to each state-of-charge value keeps increasing monotonically after the preset state-of-charge value. Therefore, in this case, it is determined that the state-of-charge value corresponding to the preset cutoff voltage is the maximum state-of-charge value.

In this embodiment of this application, the maximum state-of-charge value that is allowed to be reached when the charging is performed at the first current under the first temperature is determined directly based on the impedance value. Alternatively, a schematic diagram of the variation relationship between the impedance and the state-of-charge value is constructed to determine the maximum state-of-charge value that is allowed to be reached when the charging is performed at the first current under the first temperature.

Figure 4:
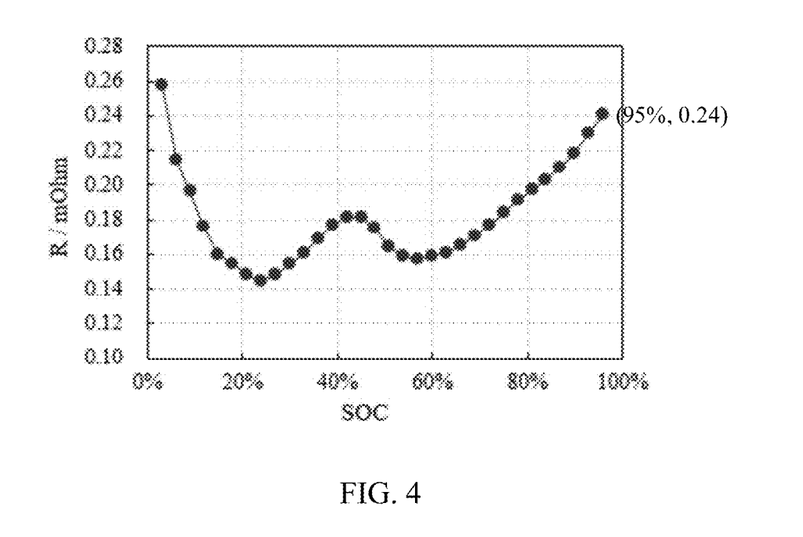
FIG. 4 is a schematic diagram of another variation relationship between an impedance and a state-of-charge value according to an embodiment of this application.

For ease of understanding, referring to FIG. 4, FIG. 4 is a schematic diagram of another variation relationship between an impedance and a state-of-charge value, where the horizontal coordinate shows the state-of-charge value of the to-be-tested battery, and the vertical coordinate shows a calculated impedance. It is assumed that the preset state-of-charge value is 60%. When the impedance corresponding to each state-of-charge value shows a monotonically increasing trend after the to-be-tested battery reaches the preset state-of-charge value of 60%, it is determined that the maximum state-of-charge value is 95% that is the state-of-charge value corresponding to the preset cutoff voltage.

As can be seen from the analysis above, when a side reaction occurs in the to-be-tested battery, the impedance will decrease. However, the impedance shown in FIG. 4 keeps increasing when the state of charge falls between the preset state-of-charge value 60% and the state-of-charge value 95% corresponding to the preset cutoff voltage. It indicates that no side reaction occurs in the to-be-tested battery when the state of charge is in such a range. In this case, it is considered that the first current is sufficient for charging the to-be-tested battery to the state of charge corresponding to the preset cutoff voltage.

Figure 5:
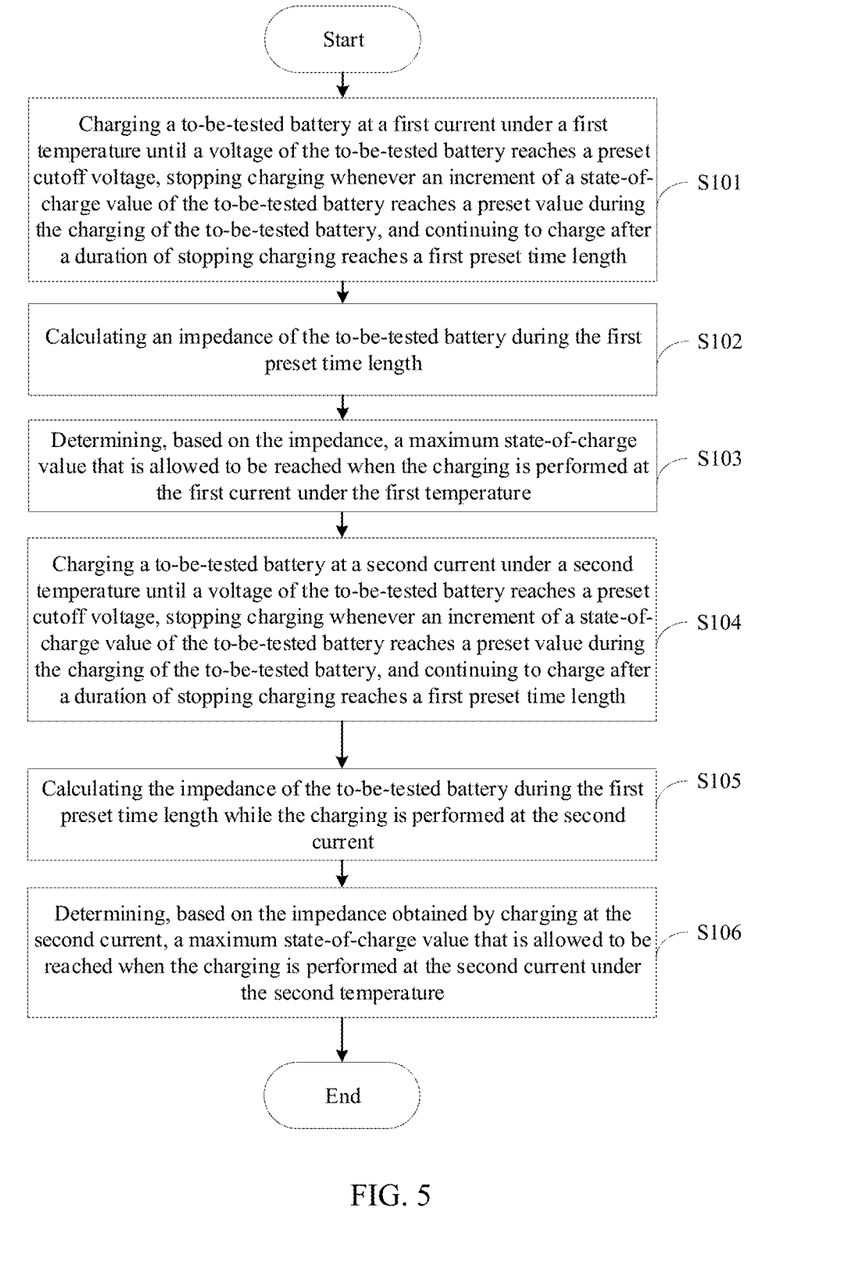
FIG. 5 is a flowchart of steps of another charge current test method according to an embodiment of this application.

Referring to FIG. 5, after step S103, the method further includes: steps S104 to S106.

Step S104: Charging the to-be-tested battery at a second current under a second temperature until the voltage of the to-be-tested battery reaches the preset cutoff voltage, stopping charging whenever the increment of the state-of-charge value of the to-be-tested battery reaches the preset value during the charging of the to-be-tested battery, and continuing to charge after the duration of stopping charging reaches the first preset time length.

Step S105: Calculating the impedance of the to-be-tested battery during the first preset time length while the charging is performed at the second current.

A formula for calculating the impedance in step S105 is:

impedance=(the voltage of the to-be-tested battery when the charging is stopped−the voltage of the to-be-tested battery after the charging has been stopped for the first preset time length)/the second current.

When the increment of the state-of-charge value of the to-be-tested battery reaches a preset value, the controller obtains a voltage of the to-be-tested battery through the voltage collection circuit at this time. When the duration of stopping charging reaches the first preset time length, the controller obtains a voltage of the to-be-tested battery again through the voltage collection circuit. Then the controller subtracts the subsequently obtained voltage from the previously obtained voltage to obtain a difference, and divides the difference by the second current at which the to-be-tested battery is charged, so as to obtain the impedance of the to-be-tested battery during the first preset time length.

Step S106: Determining, based on the impedance obtained by charging at the second current, a maximum state-of-charge value that is allowed to be reached when the charging is performed at the second current under the second temperature.

It needs to be noted that steps S104 to S106 are steps of testing the to-be-tested battery at a temperature and/or current that are different from those applied in steps S101 to S103. The description of the test method of the to-be-tested battery in steps S101 to S103 is applicable to steps S104 to S106, and for brevity, is omitted here.

To facilitate observation of the maximum state-of-charge values corresponding to different currents and different temperatures of the to-be-tested battery, after step S106, the method further includes: constructing a charge current matrix table based on the first temperature, the first current, the second temperature, the second current, the maximum state-of-charge value that is allowed to be reached when the charging is performed at the first current under the first temperature, and the maximum state-of-charge value that is allowed to be reached when the charging is performed at the second current under the second temperature.

After step S106, two data groups are obtained. The first data group includes the first temperature, the first current, and the maximum state-of-charge value that is allowed to be reached when the charging is performed at the first current under the first temperature. The second data group includes the second temperature, the second current, and the maximum state-of-charge value that is allowed to be reached when the charging is performed at the second current under the second temperature. Then a charge current matrix table can be constructed based on the two data groups. For the charge current matrix table, refer to Table 1.

TABLE 1

| Test temperature | Charge current | |
|---|---|---|
| | First current | Second current |
| First temperature | SOC 11 | |
| Second temperature | | SOC 22 |

In Table 1, SOC 11 represents the maximum state-of-charge value that is allowed to be reached when the charging is performed at the first current under the first temperature, and SOC 22 represents the maximum state-of-charge value that is allowed to be reached when the charging is performed at the second current under the second temperature.

After Table 1 is obtained, Table 1 may be stored in the controller. In the subsequent charge control, the controller may control the charge current of a target battery of the same type as the to-be-tested battery based on the data in Table 1, thereby ensuring that the target battery is always charged at a safe charge current. For example, when the target battery needs to be charged to a state of charge of SOC 11 under the first temperature, the target battery is charged at a current less than or equal to the first current.

Understandably, the charge current test method according to this embodiment of this application can be used to test the to-be-tested battery at other current values under other temperature values, or to test the to-be-tested battery by controlling different temperatures under the same current, or to test the to-be-tested battery by controlling different currents under the same temperature. Correspondingly, a charge current matrix table containing more data may be constructed based on the foregoing test results.

For the constructed charge current matrix table containing more data, refer to Table 2.

TABLE 2

| Test Temperature | Charge current | | | |
|---|---|---|---|---|
| | First current | Second current | ... | The $m^{th}$ current |
| First temperature | SOC 11 | SOC 21 | | SOC m1 |
| Second temperature | SOC 12 | SOC 22 | | SOC m2 |
| ... | | | | |
| The $n^{th}$ temperature | SOC 1n | SOC 2n | | SOC mn |

In Table 2, SOC 11 represents the maximum state-of-charge value that is allowed to be reached when the charging is performed at the first current under the first temperature, SOC 21 represents the maximum state-of-charge value that is allowed to be reached when the charging is performed at the second current under the first temperature, SOC 12 represents the maximum state-of-charge value that is allowed to be reached when the charging is performed at the first current under the second temperature, and so on, and SOC mn represents the maximum state-of-charge value that is allowed to be reached when the charging is performed at the $m^{th}$ current under the $n^{th}$ temperature.

The following uses a complete example to describe the charge current test method according to an embodiment of this application with reference to Table 2.

Step 1: Obtaining a to-be-tested battery, and then testing an actual capacity of the to-be-tested battery. Specifically, the to-be-tested battery is discharged at a constant current under the room temperature (the discharge rate may be 0.04 C to 1.0 C) until the lower-limit cutoff voltage, and then the to-be-tested battery is charged at a constant current (the charge rate may be 0.04 C to 1.0 C) until the upper-limit cutoff voltage, and then the to-be-tested battery is charged at a constant voltage equal to the upper-limit cutoff voltage until the current reaches a minimum rate (0.01 C to 0.1 C). Then the to-be-tested battery is discharged again at a constant current (the discharge rate may be 0.04 C to 1.0 C) until the lower-limit cutoff voltage, and the discharge capacity at this time is recorded as C0. To ensure accuracy of C0, the foregoing process may be repeated for N cycles (N is a natural number greater than 1), and C0 obtained in the $N^{th}$ cycle is recorded as the actual capacity.

Step 2: Leaving the to-be-tested battery to stand under a room temperature for a second preset time length to ensure that the to-be-tested battery reaches thermal equilibrium under the room temperature.

Step 3: When the temperature that needs to be tested is the first temperature, leaving the to-be-tested battery to stand under the first temperature for a third preset time length to ensure that the to-be-tested battery reaches thermal equilibrium under the first temperature.

Step 4: Charging the to-be-tested battery at the first current by starting from a state of charge of 0% of the to-be-tested battery. When the increment of the state-of-charge value of the to-be-tested battery reaches a preset value, stopping charging for a first preset time length, then recording a voltage variation that occurs before and after an elapse of the first preset time length of standing, and calculating an impedance corresponding to the current voltage variation. Then continuing to charge. When the increment of the state-of-charge value of the to-be-tested battery reaches the preset value again, stopping charging for the first preset time length, then recording a voltage variation that occurs before and after an elapse of the first preset time length of standing, and calculating an impedance corresponding to the current voltage variation, and so on, and then continuing the test in this way until the voltage of the to-be-tested battery reaches the preset cutoff voltage. Finally, the maximum state-of-charge value SOC 11 that is allowed to be reached when the charging is performed at the first current under the first temperature can be determined based on all impedances.

Step 5: Changing the test temperature and/or charge current, and repeating steps 2 to 4 above to obtain SOC 12, SOC 21, ..., SOC m1, SOC 1n, ..., and SOC mn separately.

Step 6: Constructing a charge current matrix table (as shown in Table 2) based on all the data.

After Table 2 is obtained, Table 2 may be stored in the controller. In the subsequent charge control, the controller may control the charge current of a target battery of the same type as the to-be-tested battery based on the data in Table 2, thereby ensuring that the target battery is always charged at a safe charge current.

To sum up, in the test method according to this embodiment of this application, the charging is stopped whenever the increment of the state-of-charge value of the to-be-tested battery reaches the preset value while the to-be-tested battery is charged at the first current under the first temperature. The charging is continued after the duration of stopping charging reaches the first preset time length. The impedance during each first preset time length is calculated, and the maximum state-of-charge value that is allowed to be reached when the charging is performed at the first current under the first temperature is determined based on the impedance. In this way, the impedance change of the to-be-tested battery during the charging can be determined. In the foregoing process, whether a side reaction occurs in the to-be-tested battery can be determined based on the impedance change, and then the correspondence between the charge current of the to-be-tested battery and the state-of-charge value can be accurately determined. Compared with the prior art, the foregoing solution enables direct test of most commercial batteries on the market without a need to manufacture a special-purpose three-electrode battery. In addition, the solution takes temperature into account, thereby improving accuracy of test results. In addition, the solution can also test batteries that have aged in any aging state, and is widely applicable.

Figure 6:
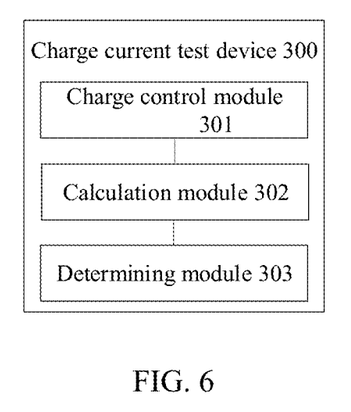
FIG. 6 is a modular block diagram of a charge current test device according to an embodiment of this application.

Referring to FIG. 6, based on the same inventive conception, an embodiment of this application further provides a charge current test device 300, including a charge control module 301, a calculation module 302, and a determining module 303.

The charge control module 301 is configured to charge a to-be-tested battery at a first current under a first temperature until a voltage of the to-be-tested battery reaches a preset cutoff voltage, stop charging whenever an increment of a state-of-charge value of the to-be-tested battery reaches a preset value during the charging of the to-be-tested battery, and continue to charge after a duration of stopping charging reaches a first preset time length.

The calculation module 302 is configured to calculate an impedance of the to-be-tested battery during the first preset time length.

The determining module 303 is configured to determine, based on the impedance, a maximum state-of-charge value that is allowed to be reached when the charging is performed at the first current under the first temperature.

In some embodiments, the determining module 303 is specifically configured to obtain a state-of-charge value corresponding to each of the impedances; and determine, when an impedance corresponding to a next state-of-charge value is less than an impedance corresponding to a previous state-of-charge value for a first time after a preset state-of-charge value, that the maximum state-of-charge value is the previous state-of-charge value.

In some embodiments, the determining module 303 is specifically configured to obtain a state-of-charge value corresponding to each of the impedances; and determine, when an impedance corresponding to each next state-of-charge value is greater than an impedance corresponding to a previous state-of-charge value after a preset state-of-charge value, that the maximum state-of-charge value is a state-of-charge value corresponding to the preset cutoff voltage.

In some embodiments, the charge control module 301 is further configured to: before charging the to-be-tested battery at the first current under the first temperature, obtain an actual capacity of the to-be-tested battery under a room temperature; and discharge the to-be-tested battery that has been left to stand for a second preset time length under the room temperature, until the voltage of the to-be-tested battery reaches a lower-limit cutoff voltage.

In some embodiments, the charge control module 301 is specifically configured to charge, at the first current, the to-be-tested battery that has been left to stand for a third preset time length under the first temperature.

In some embodiments, the charge control module 301 is further configured to estimate a current state-of-charge value of the to-be-tested battery before charging the to-be-tested battery at the first current under the first temperature.

In some embodiments, the charge control module 301 is further configured to charge a to-be-tested battery at a second current under a second temperature until a voltage of the to-be-tested battery reaches a preset cutoff voltage, stop charging whenever an increment of a state-of-charge value of the to-be-tested battery reaches a preset value during the charging of the to-be-tested battery, and continue to charge after a duration of stopping charging reaches a first preset time length. Correspondingly, the calculation module 302 is further configured to calculate the impedance of the to-be-tested battery during the first preset time length while the charging is performed at the second current. Correspondingly, the determining module 303 is further configured to determine, based on the impedance obtained by charging at the second current, a maximum state-of-charge value that is allowed to be reached when the charging is performed at the second current under the second temperature.

In some embodiments, the device further includes a construction module. The construction module is configured to: after determining, based on the impedance obtained by charging at the second current, the maximum state-of-charge value that is allowed to be reached when the charging is performed at the second current under the second temperature, construct a charge current matrix table based on the first temperature, the first current, the second temperature, the second current, the maximum state-of-charge value that is allowed to be reached when the charging is performed at the first current under the first temperature, and the maximum state-of-charge value that is allowed to be reached when the charging is performed at the second current under the second temperature.

It needs to be noted that, it can be clearly understood by a person skilled in the art that for ease and brevity of description, a specific working process of the foregoing system, device, and units can be obtained by referring to a corresponding process in the preceding method embodiment, and the details are omitted here.

Based on the same inventive conception, an embodiment of this application further provides a computer-readable storage medium on which a computer program is stored. When executed, the computer program performs the method provided in the foregoing embodiment.

The storage medium may be any available medium accessible to a computer, or a data storage device such as a server or data center that integrates one or more available media. The available media may be a magnetic medium (such as a floppy disk, a hard disk, or a magnetic tape), an optical medium (such as a DVD), or a semiconductor medium (such as a solid state disk (SSD)).

In the embodiments provided in this application, it is understandable that the disclosed device and method may be implemented by other means. The device embodiment described above is merely exemplary. For example, the unit division is merely division with respect to logical functions, and in actual implementations, the units may be divided in other manners. For another example, a plurality of units or components may be combined or integrated into another system, or some features may be ignored or not implemented. In addition, the displayed or discussed mutual couplings or direct couplings or communications connections may be implemented through some communications interfaces. The indirect couplings or communications connections between the devices or units may be implemented in electronic, mechanical or other forms.

In addition, the units described as discrete components above may be separated physically or not; and the components illustrated as units may be physical units or not, that is, they may be located in one place or distributed on a plurality of network elements. Some or all of the units may be selected according to actual needs to achieve the objectives of the solutions of the embodiments.

In addition, function modules in each embodiment of this application may be integrated together to form a stand-alone part, or each module may exist alone, or two or more modules may be integrated into a stand-alone part.

The relational terms herein such as first and second are used merely to differentiate one entity or operation from another, and do not necessarily require or imply any actual relationship or sequence between the entities or operations.

What is described above is merely embodiments of this application, but not intended to limit the protection scope of this application. To a person skilled in the art, various modifications and variations may be made to this application. Any modifications, equivalent replacements, improvements, and the like made without departing from the spirit and principles of this application fall within the protection scope of this application.

What is claimed is:

1. A charge current test method, comprising:
   charging a to-be-tested battery at a first current under a first temperature until a voltage of the to-be-tested battery reaches a preset cutoff voltage, stopping charging whenever an increment of a state-of-charge value of the to-be-tested battery reaches a preset value during the charging of the to-be-tested battery, and continuing to charge after a duration of stopping charging reaches a first preset time length;

calculating an impedance of the to-be-tested battery during the first preset time length; and determining, based on the impedance, a maximum state-of-charge value that is allowed to be reached when the charging is performed at the first current under the first temperature.

2. The method according to claim 1, wherein the impedance=(the voltage of the to-be-tested battery when the charging is stopped−the voltage of the to-be-tested battery after the charging has been stopped for the first preset time length)/the first current.

3. The method according to claim 1, wherein the determining, based on the impedance, a maximum state-of-charge value that is allowed to be reached when the charging is performed at the first current under the first temperature comprises:

obtaining a state-of-charge value corresponding to each of the impedances; and determining, when an impedance corresponding to a next state-of-charge value is less than an impedance corresponding to a previous state-of-charge value for a first time after a preset state-of-charge value, that the maximum state-of-charge value is the previous state-of-charge value.

4. The method according to claim 1, wherein the determining, based on the impedance, a maximum state-of-charge value that is allowed to be reached when the charging is performed at the first current under the first temperature comprises:

obtaining a state-of-charge value corresponding to each of the impedances; and determining, when an impedance corresponding to each next state-of-charge value is greater than an impedance corresponding to a previous state-of-charge value after a preset state-of-charge value, that the maximum state-of-charge value is a state-of-charge value corresponding to the preset cutoff voltage.

5. The method according to claim 1, wherein, before the charging a to-be-tested battery at a first current under a first temperature, the method further comprises:

obtaining an actual capacity of the to-be-tested battery under a room temperature; and discharging the to-be-tested battery that has been left to stand for a second preset time length under the room temperature, until the voltage of the to-be-tested battery reaches a lower-limit cutoff voltage.

6. The method according to claim 1, wherein the charging a to-be-tested battery at a first current under a first temperature comprises:

charging, at the first current, the to-be-tested battery that has been left to stand for a third preset time length under the first temperature.

7. The method according to claim 1, wherein, before the charging a to-be-tested battery at a first current under a first temperature, the method further comprises:

estimating a current state-of-charge value of the to-be-tested battery.

8. The method according to claim 1, further comprising: charging the to-be-tested battery at a second current under a second temperature until the voltage of the to-be-tested battery reaches the preset cutoff voltage, stopping charging whenever the increment of the state-of-charge value of the to-be-tested battery reaches the preset value during the charging of the to-be-tested battery, and continuing to charge after the duration of stopping charging reaches the first preset time length;

calculating the impedance of the to-be-tested battery during the first preset time length while the charging is performed at the second current; and determining, based on the impedance obtained by charging at the second current, a maximum state-of-charge value that is allowed to be reached when the charging is performed at the second current under the second temperature.

9. The method according to claim 8, wherein the impedance obtained by charging at the second current=(the voltage of the to-be-tested battery when the charging is stopped−the voltage of the to-be-tested battery after the charging has been stopped for the first preset time length)/the second current.

10. The method according to claim 8, wherein, after the determining, based on the impedance obtained by charging at the second current, a maximum state-of-charge value that is allowed to be reached when the charging is performed at the second current under the second temperature, the method further comprises:

constructing a charge current matrix table based on the first temperature, the first current, the second temperature, the second current, the maximum state-of-charge value that is allowed to be reached when the charging is performed at the first current under the first temperature, and the maximum state-of-charge value that is allowed to be reached when the charging is performed at the second current under the second temperature.

11. A charge current test device, comprising:

a charge control module, configured to charge a to-be-tested battery at a first current under a first temperature until a voltage of the to-be-tested battery reaches a preset cutoff voltage, stop charging whenever an increment of a state-of-charge value of the to-be-tested battery reaches a preset value during the charging of the to-be-tested battery, and continue to charge after a duration of stopping charging reaches a first preset time length;

a calculation module, configured to calculate an impedance of the to-be-tested battery during the first preset time length; and a determining module, configured to determine, based on the impedance, a maximum state-of-charge value that is allowed to be reached when the charging is performed at the first current under the first temperature.

12. The device according to claim 11, wherein the determining module is specifically configured to obtain a state-of-charge value corresponding to each of the impedances; and determine, when an impedance corresponding to a next state-of-charge value is less than an impedance corresponding to a previous state-of-charge value for a first time after a preset state-of-charge value, that the maximum state-of-charge value is the previous state-of-charge value.

13. The device according to claim 11, wherein the determining module is specifically configured to obtain a state-of-charge value corresponding to each of the impedances; and determine, when an impedance corresponding to each next state-of-charge value is greater than an impedance corresponding to a previous state-of-charge value after a preset state-of-charge value, that the maximum state-of-charge value is a state-of-charge value corresponding to the preset cutoff voltage.

14. The device according to claim 11, wherein the charge control module is further configured to: before charging the to-be-tested battery at the first current under the first temperature, obtain an actual capacity of the to-be-tested battery under a room temperature; and discharge the to-be-tested battery that has been left to stand for a second preset time length under the room temperature, until the voltage of the to-be-tested battery reaches a lower-limit cutoff voltage.

15. The device according to claim 11, wherein the charge control module is specifically configured to charge, at the first current, the to-be-tested battery that has been left to stand for a third preset time length under the first temperature.

16. The device according to claim 11, wherein the charge control module is further configured to estimate a current state-of-charge value of the to-be-tested battery before charging the to-be-tested battery at the first current under the first temperature.

17. The device according to claim 11, wherein the charge control module is further configured to: charge the to-be-tested battery at a second current under a second temperature until the voltage of the to-be-tested battery reaches the preset cutoff voltage, stop charging whenever the increment of the state-of-charge value of the to-be-tested battery reaches the preset value during the charging of the to-be-tested battery, and continue to charge after the duration of stopping charging reaches the first preset time length;
the calculation module is further configured to calculate the impedance of the to-be-tested battery during the first preset time length while the charging is performed at the second current; and
the determining module is further configured to determine, based on the impedance obtained by charging at the second current, a maximum state-of-charge value that is allowed to be reached when the charging is performed at the second current under the second temperature.

18. The device according to claim 17, wherein the impedance=(the voltage of the to-be-tested battery when the charging is stopped−the voltage of the to-be-tested battery after the charging has been stopped for the first preset time length)/the first current; and the impedance obtained by charging at the second current=(the voltage of the to-be-tested battery when the charging is stopped−the voltage of the to-be-tested battery after the charging has been stopped for the first preset time length)/the second current.

19. The device according to claim 17, wherein the device further comprises a construction module, and
the construction module is configured to: after determining, based on the impedance obtained by charging at the second current, the maximum state-of-charge value that is allowed to be reached when the charging is performed at the second current under the second temperature, construct a charge current matrix table based on the first temperature, the first current, the second temperature, the second current, the maximum state-of-charge value that is allowed to be reached when the charging is performed at the first current under the first temperature, and the maximum state-of-charge value that is allowed to be reached when the charging is performed at the second current under the second temperature.

20. A charge test system, comprising a charging device and a temperature control device;
the temperature control device is configured to control a test temperature of the to-be-tested battery; and
the charging device comprises a controller, a charge control circuit, and a voltage collection circuit; the controller is connected to the charge control circuit and the voltage collection circuit separately; the charge control circuit is configured to charge the to-be-tested battery, and the voltage collection circuit is configured to obtain a voltage of the to-be-tested battery; and the controller is configured to perform the method according to claim 1.

* * * * *